(12) United States Patent
Rokuhara

(10) Patent No.: US 8,497,567 B2
(45) Date of Patent: Jul. 30, 2013

(54) THIN-FILM CAPACITOR, MULTILAYER WIRING BOARD AND SEMICONDUCTOR DEVICE

(75) Inventor: Shinji Rokuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/523,301

(22) Filed: Jun. 14, 2012

(65) Prior Publication Data

US 2012/0326272 A1 Dec. 27, 2012

(30) Foreign Application Priority Data

Jun. 23, 2011 (JP) .................. 2011-139836

(51) Int. Cl.
*H01L 27/08* (2006.01)

(52) U.S. Cl.
USPC .................. 257/532; 257/E27.048

(58) Field of Classification Search
USPC .......................... 257/532, E27.048
See application file for complete search history.

(56) References Cited

U.S. PATENT DOCUMENTS

| | | | | |
|---|---|---|---|---|
| 6,515,324 B2 * | 2/2003 | Shibuya et al. | ............... | 257/296 |
| 7,614,142 B2 * | 11/2009 | Shioga et al. | ................... | 29/830 |
| 2007/0096254 A1 * | 5/2007 | Ritter et al. | .................... | 257/532 |
| 2012/0018206 A1 * | 1/2012 | Suenaga et al. | ............... | 174/260 |

FOREIGN PATENT DOCUMENTS

| | | |
|---|---|---|
| JP | 11-045822 | 2/1999 |
| JP | 2005-072311 | 3/2005 |
| JP | 2007-116178 | 5/2007 |
| JP | 2007-116179 | 5/2007 |

OTHER PUBLICATIONS

Prathap K. Muthana; Design of High Speed Packages and Boards Using Embedded Decoupling Capacitors; Georgia Institute of Technology; 2007.

* cited by examiner

Primary Examiner — Trung Q Dang
(74) Attorney, Agent, or Firm — Dentons US LLP

(57) ABSTRACT

A thin-film capacitor with first capacitative elements each having an electrode layer with a first polarity on an upper surface of a dielectric layer and an electrode layer with a second polarity on a lower surface of the dielectric layer; second capacitative elements each having an electrode layer with the second polarity on the upper surface and an electrode layer with the first polarity on the lower surface and arranged around a specific position alternately with the first capacitative elements; a single common connection hole at the specific position connecting all electrode layers with the first polarity of the first and second capacitative elements; and individual connection holes around the common connection hole connecting each electrode layer with the second polarity of the adjacent and second capacitative elements.

9 Claims, 13 Drawing Sheets

UPPER ELECTRODE

LOWER ELECTRODE

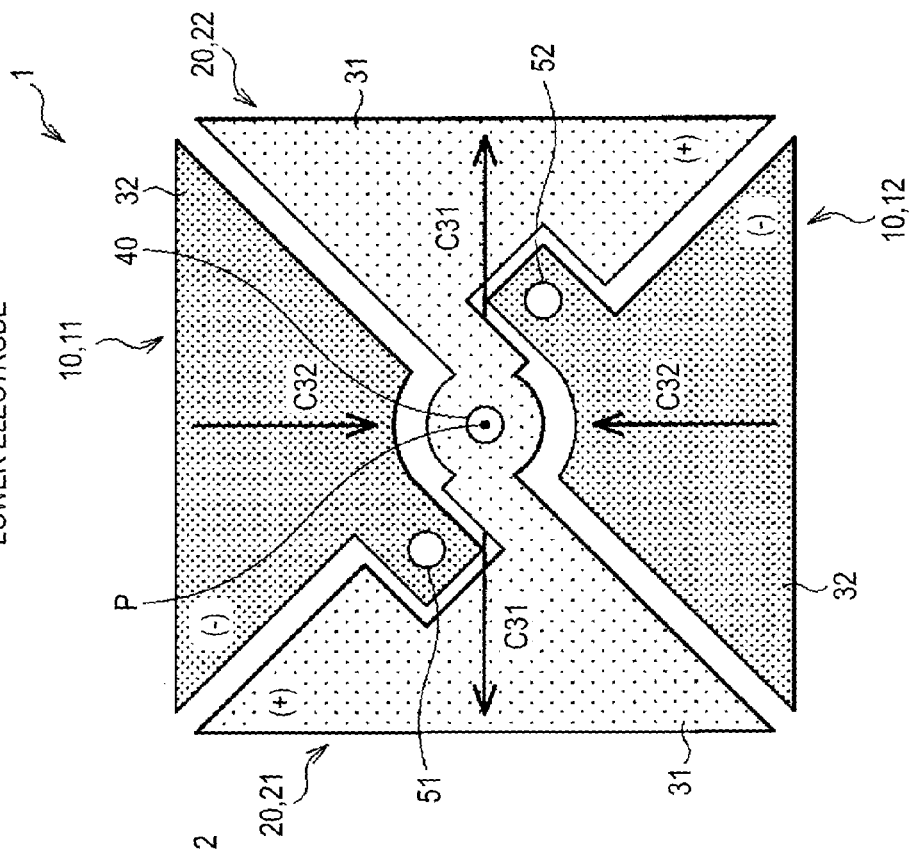
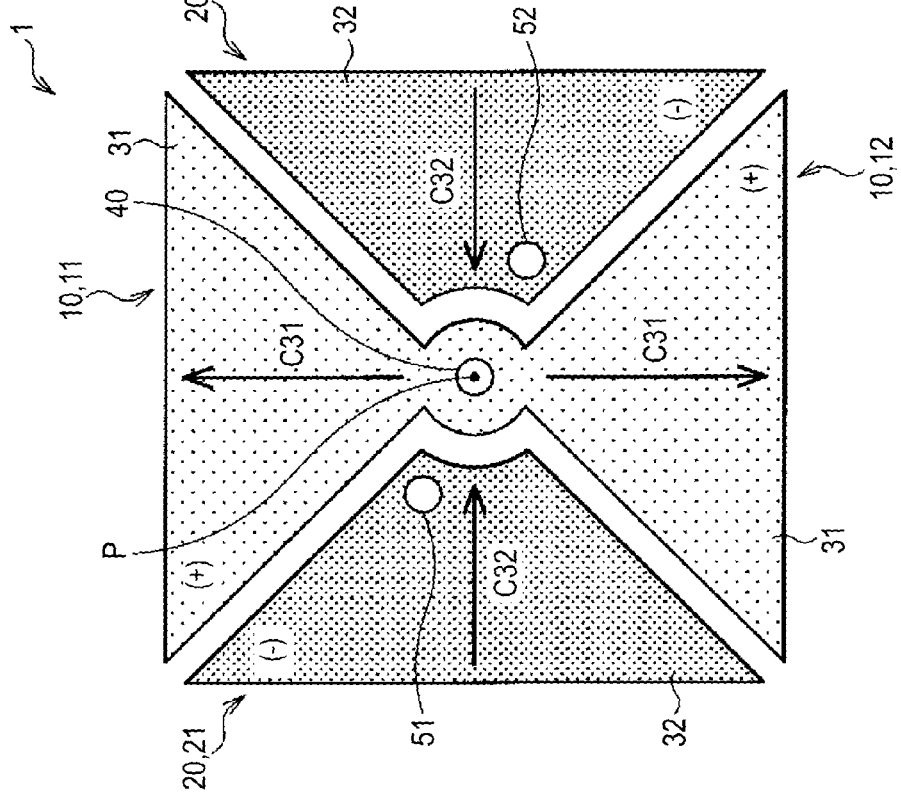

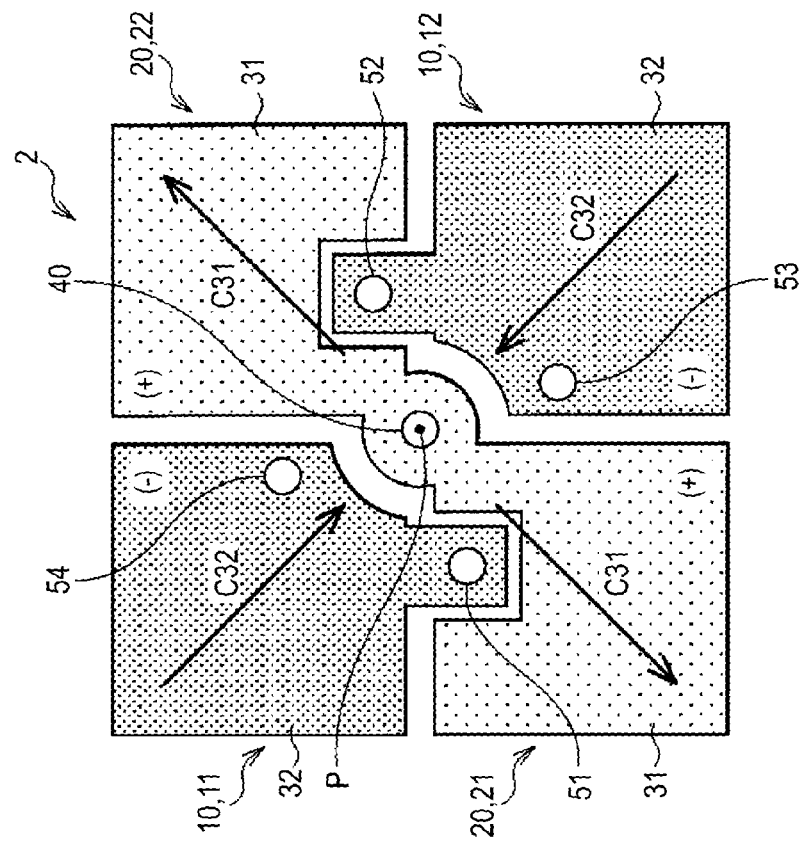
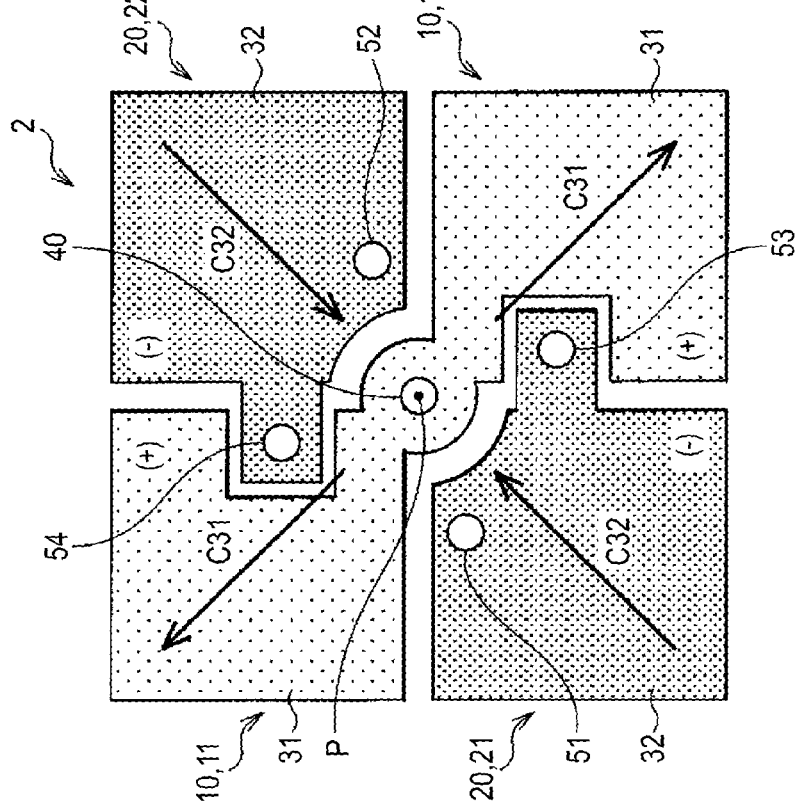

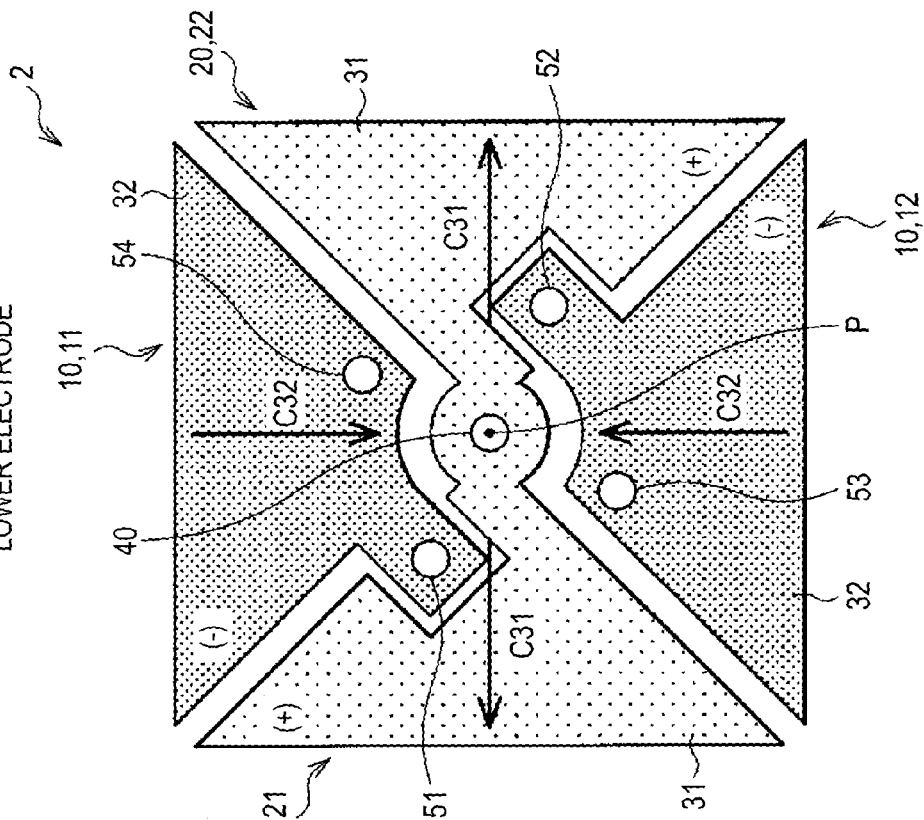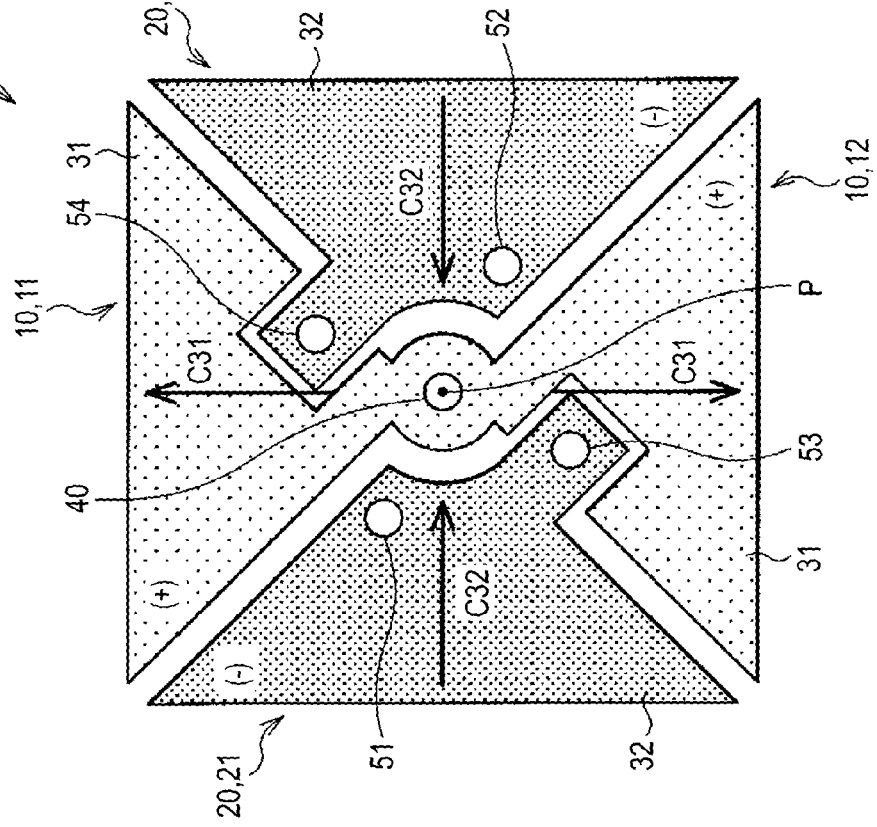

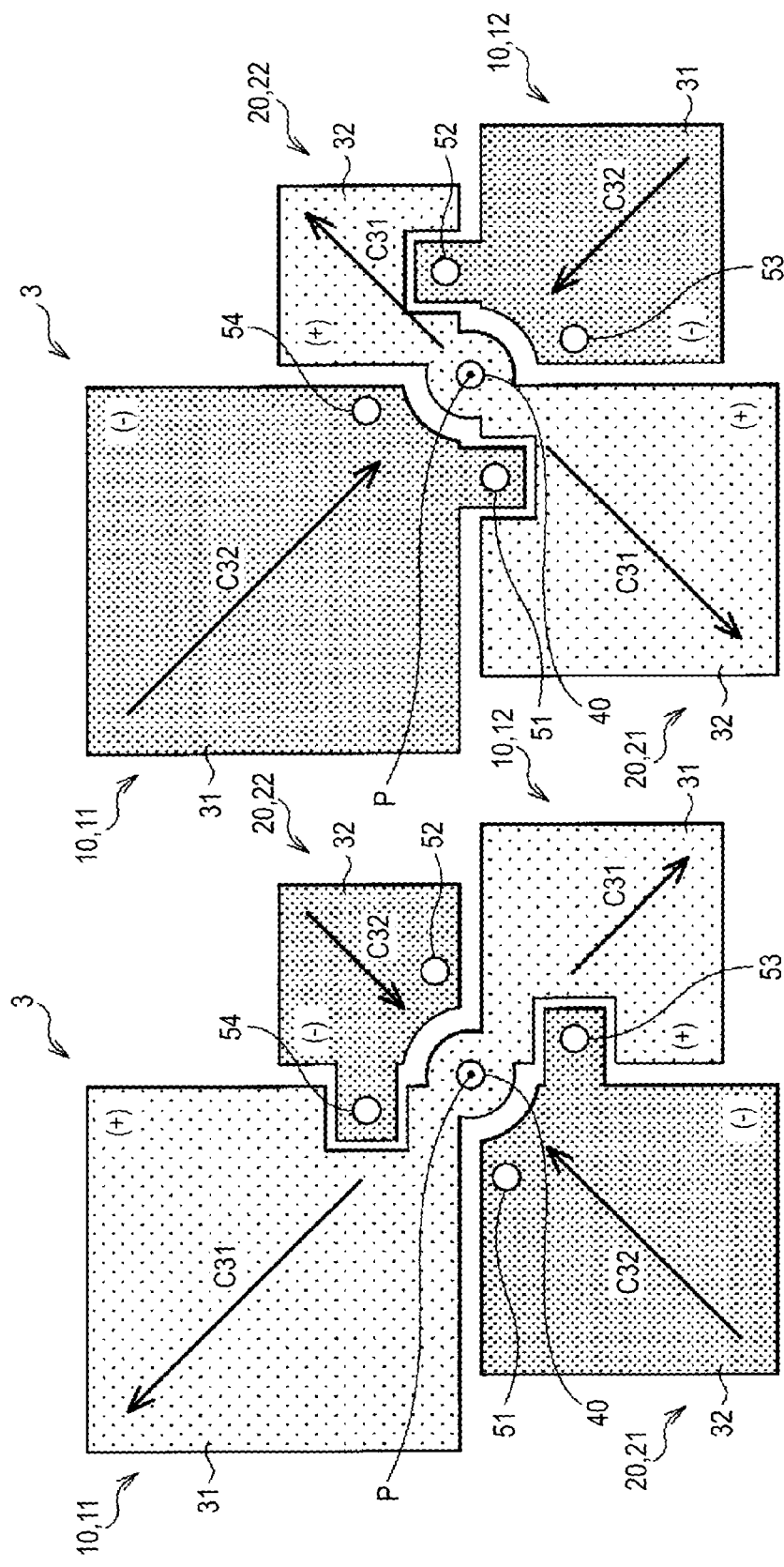

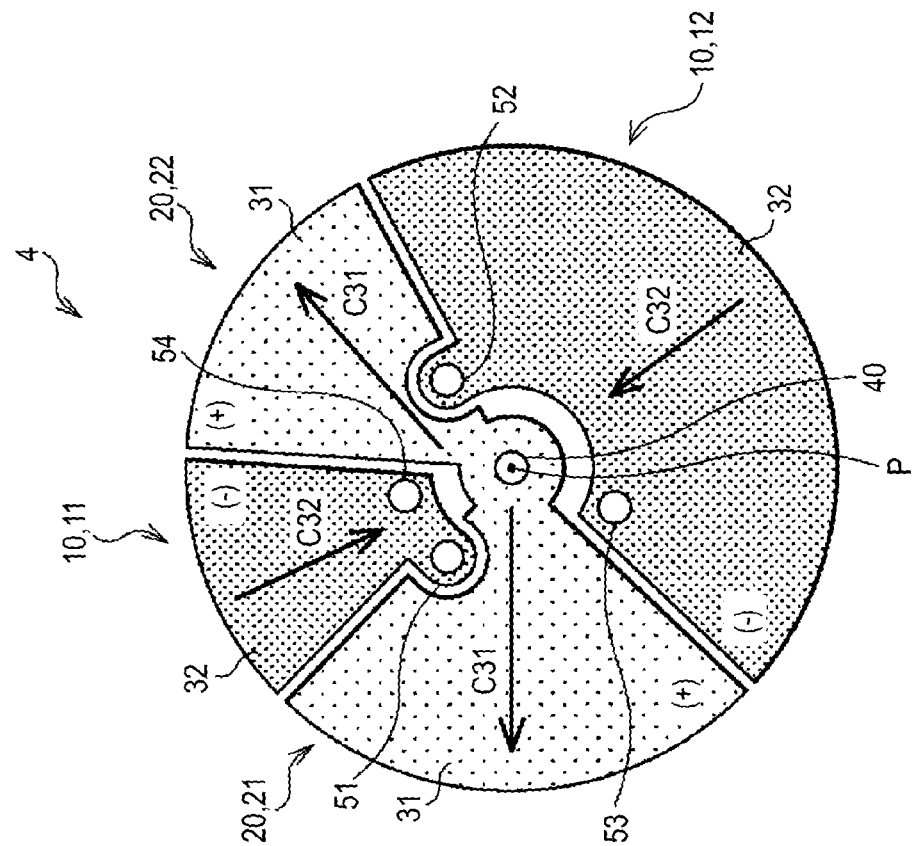
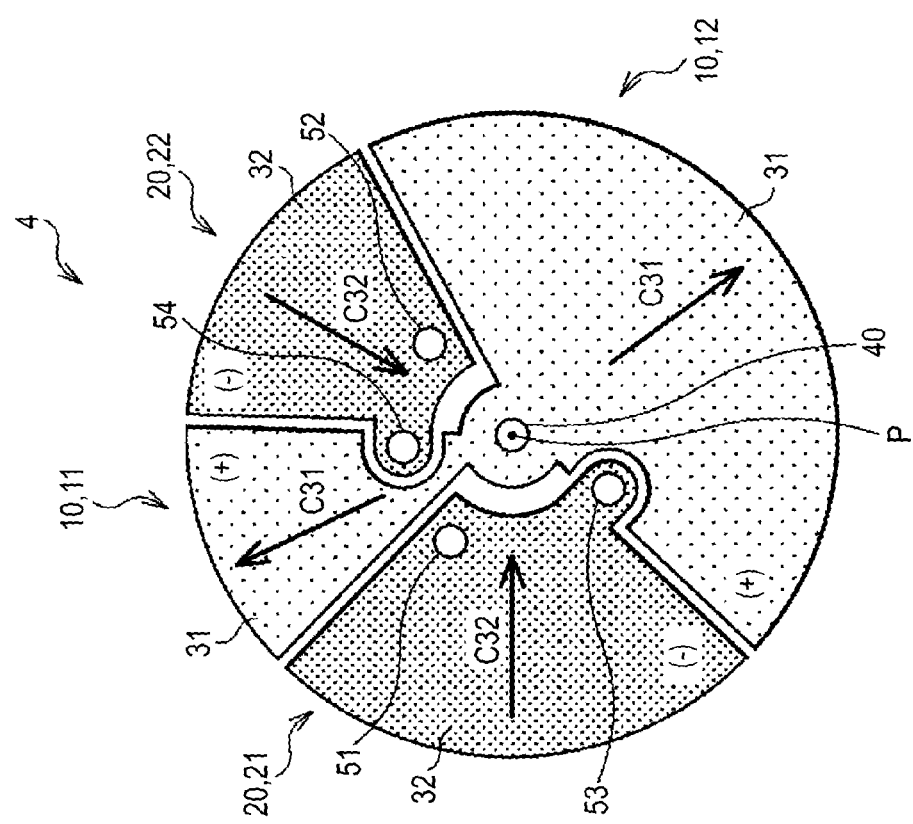

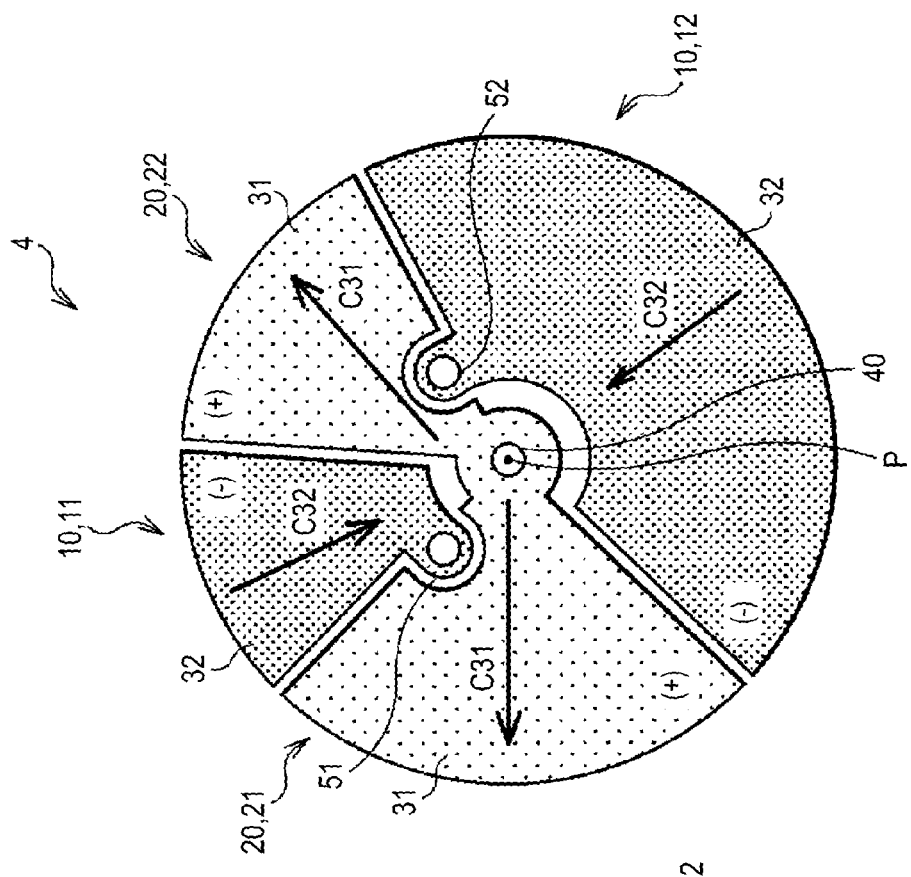
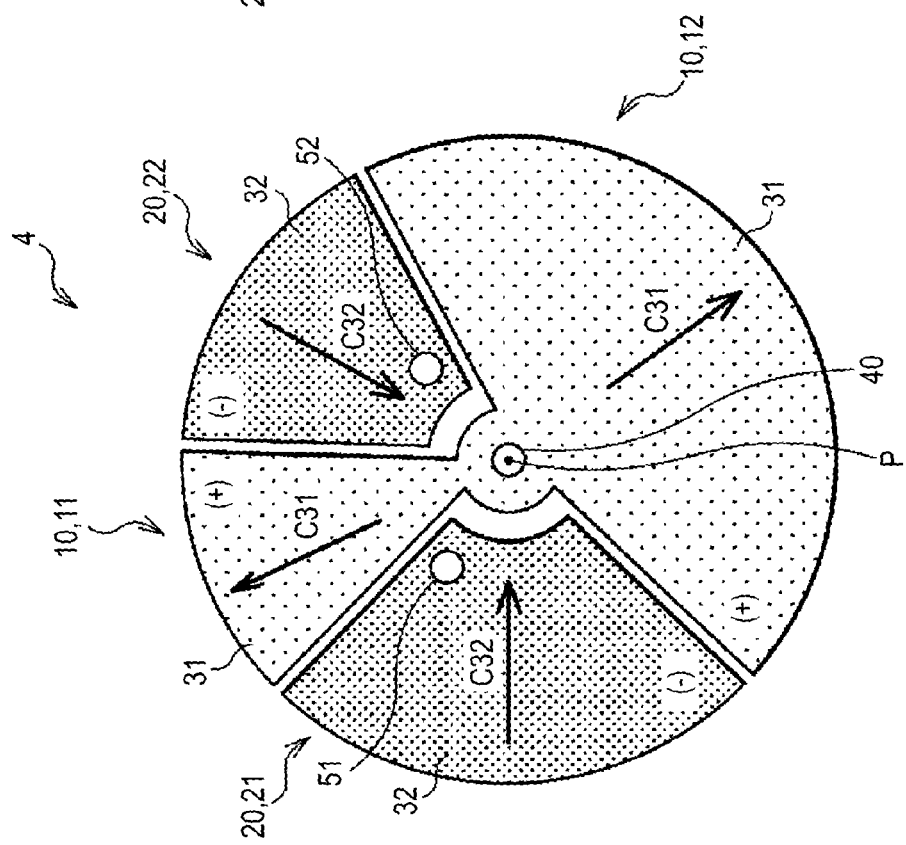

THIN-FILM CAPACITOR, MULTILAYER WIRING BOARD AND SEMICONDUCTOR DEVICE

FIELD

The present disclosure relates to a thin-film capacitor preferable for a decoupling capacitor or the like, a multilayer wiring board such as a printed wiring board or an interposer board containing the thin-film capacitor, and a semiconductor device including the multilayer wiring board.

BACKGROUND

With the higher speed, the higher capacity, and higher density of electronic circuits, power and currents increase as power voltages decrease, and power distribution is a significant issue in present electronics systems. A current is necessary for a switching transistor circuit to charge load and the current, which is impossible to be supplied from a voltage regulator module (VRM), is supplied by the decoupling capacitor. The decoupling capacitor causes a resonance phenomenon by an equivalent series inductance (ESL) component and the capacity of the capacitor, and acts as an inductance in a region higher than the resonance frequency and causes increase in impedance. The decoupling capacitor is placed as near the semiconductor device as possible for reduction of the ESL.

Further, to realize the lower impedance than that of a surface-mounted capacitor, a study on embedding of a capacitor in a semiconductor package or a board using a thin dielectric material between the power plane and the ground plane has been made (for example, see Non-patent Document 1 (Prathap K. Muthana, Design of high speed package and boards using embedded decoupling capacitors, (U.S.), Georgia Institute of Technology, August, 2007)). In the embedded decoupling capacitor, it is possible to make the wiring distance to the semiconductor device shorter than that of the surface-mounted capacitor.

However, in the embedded decoupling capacitor in related art, for example, as pointed out in Patent Document 2 (JP-A-2005-72311), respective electrodes at both sides with a dielectric layer of the capacitor in between are respectively connected to single electrode terminals, and the magnetic field formed by one current channel is not cancelled and reduced by the magnetic field formed by another near current channel. Thus, the effect of inductance reduction has been limited.

Accordingly, in order to further reduce the ESL, for example, in Patent Document 1 (JP-A-11-45822) and Patent Document 2, a method for setting directions of currents flowing in a pair of electrode plates or electrode layers forming the capacitor as different as possible and a method of parallel-connecting plural capacitor elements each including a pair of capacitative elements to distribute currents into n channels and make an effective inductance to 1/n (one-nth) have been proposed.

Patent Document 3 (JP-A-2007-116178) and Patent Document 4 (JP-A-2007-116179) are also cited.

SUMMARY

However, in Patent Document 1, to parallel-connecting plural capacitor elements, it is necessary to connect positive and negative electrodes to the respective capacitors, and increase in area has been inevitable. Further, in Patent Document 2, to connect via hole conductors as lead electrodes to adjacent electrode terminals provided so that polarities (positive, negative) are alternately arranged, it is necessary to form many bored parts of electrodes so that the via hole conductors in the different electrode parts may not contact, and there has been a problem of decrease ineffective electrode area.

It is therefore desirable to provide a thin-film capacitor that can reduce an inductance suppress an effective electrode area, and realize downsizing, a multilayer wiring board including the thin-film capacitor, and a semiconductor device including the multilayer wiring board.

A thin-film capacitor according to an embodiment of the present disclosure includes the following component elements (A) to (D):

(A) plural first capacitative elements each having an electrode layer with a first polarity on an upper surface of a dielectric layer and an electrode layer with a second polarity on a lower surface of the dielectric layer and arranged around a specific position;

(B) plural second capacitative elements each having an electrode layer with the second polarity on the upper surface of the dielectric layer and an electrode layer with the first polarity on the lower surface of the dielectric layer and arranged around the specific position alternately with the plural first capacitative elements;

(C) a single common connection hole provided in the specific position and connecting all electrode layers with the first polarity of the plural first capacitative elements and all electrode layers with the first polarity of the plural second capacitative elements; and (D) plural individual connection holes provided around the common connection hole and connecting each electrode layer with the second polarity of the plural first capacitative elements to the adjacent electrode layer with the second polarity of the plural second capacitative elements.

In the thin-film capacitor according to the embodiment of the present disclosure, the plural first capacitative elements each having the electrode layer with the first polarity on the upper surface of the dielectric layer and the electrode layer with the second polarity on the lower surface of the dielectric layer and the plural second capacitative elements each having the electrode layer with the second polarity on the upper surface of the dielectric layer and the electrode layer with the first polarity on the lower surface of the dielectric layer are alternately arranged around the specific position. Accordingly, the directions of the currents are opposite in the parts in which the electrode layers with the first polarity and the electrode layers with the second polarity are adjacent, generated electromagnetic fields are cancelled out, and the inductance is reduced. Further, all electrode layers with the first polarity of the plural first capacitative elements and all electrode layers with the first polarity of the plural second capacitative elements are connected by the single common connection hole. Accordingly, the number of connection holes is reduced, and reduction in effective electrode area may be suppressed and downsizing may be realized.

A multilayer wiring board according to an embodiment of the present disclosure includes the thin-film capacitor according to the embodiment of the present disclosure.

In the multilayer wiring board according to the embodiment of the present disclosure, the thin-film capacitor according to the embodiment of the present disclosure acts as a decoupling capacitor.

A semiconductor device according to an embodiment of the present disclosure includes a chip and the multilayer wiring board having the thin-film capacitor according to the embodiment of the present disclosure.

In the semiconductor device according to the embodiment of the present disclosure, the multilayer wiring board having the thin-film capacitor according to the embodiment of the present disclosure acts as a mother board.

According to the thin-film capacitor of the embodiment of the present disclosure, the plural first capacitive elements each having the electrode layer with the first polarity on the upper surface of the dielectric layer and the electrode layer with the second polarity on the lower surface of the dielectric layer and the plural second capacitive elements each having the electrode layer with the second polarity on the upper surface of the dielectric layer and the electrode layer with the first polarity on the lower surface of the dielectric layer are alternately arranged around the specific position, and thus, the inductance may be reduced. Further, all electrode layers with the first polarity of the plural first capacitive elements and all electrode layers with the first polarity of the plural second capacitive elements are connected by the single common connection hole, and thus, the number of connection holes is reduced, and reduction in effective electrode area may be suppressed and downsizing may be realized. Therefore, by building the thin-film capacitor in the multilayer wiring board or forming the semiconductor device using the multilayer wiring board, the degree of freedom of layout may be increased by downsizing of the thin-film capacitor and downsizing of the multilayer wiring board may be realized, and the wiring distance between the semiconductor device and the capacitor may be made shorter and the inductance as seen from the semiconductor device may be reduced.

BRIEF DESCRIPTION OF THE DRAWINGS

FIGS. 3A and 3B are plan views showing a configuration of a thin-film capacitor according to modified example 1 as seen from an upper surface side and a lower surface side of a dielectric layer, respectively.

FIGS. 4A and 4B are plan views showing a configuration of a thin-film capacitor according to the second embodiment of the present disclosure as seen from an upper surface side and a lower surface side of a dielectric layer, respectively.

FIGS. 5A and 5B are plan views showing a configuration of a thin-film capacitor according to modified example 2 as seen from an upper surface side and a lower surface side of a dielectric layer, respectively.

FIGS. 6A and 6B are plan views showing a configuration of a thin-film capacitor according to the third embodiment of the present disclosure as seen from an upper surface side and a lower surface side of a dielectric layer, respectively.

FIGS. 9A and 9B are plan views showing a configuration of a thin-film capacitor according to the fourth embodiment of the present disclosure as seen from an upper surface side and a lower surface side of a dielectric layer, respectively.

FIGS. 10A and 10B are plan views showing a configuration of a thin-film capacitor according to modified example 3 as seen from an upper surface side and a lower surface side of a dielectric layer, respectively.

DETAILED DESCRIPTION

Hereinafter, embodiments of the present disclosure will be explained with reference to the drawings. The explanation will be made in the following order.

1. First Embodiment (Thin-film Capacitor: an example in which two first capacitative elements and two second capacitative elements have square shapes with the same dimensions and each electrode with the second polarity of the first capacitative elements is connected to one adjacent electrode with the second polarity of the second capacitative elements via an individual connection hole)

2. Modified Example 1 (Thin-film Capacitor: an example in which first capacitative elements and second capacitative elements have triangular shapes)

3. Second Embodiment (Thin-film Capacitor: an example in which two first capacitative elements and two second capacitative elements have square shapes with the same dimensions and each electrode with the second polarity of all first capacitative elements is connected to each electrode with the second polarity of all second capacitative elements via an individual connection hole)

4. Modified Example 2 (Thin-film Capacitor: an example in which first capacitative elements and second capacitative elements have triangular shapes)

5. Third Embodiment (Thin-film Capacitor: an example in which two first capacitative elements and two second capacitative elements have square shapes with different dimensions and each electrode with the second polarity of all first capacitative elements is connected to each electrode with the second polarity of all second capacitative elements via an individual connection hole)

6. Fourth Embodiment (Thin-film Capacitor: an example in which first capacitative elements and second capacitative elements respectively have sector shapes with different center angles and entirely form a circular shape)

7. Modified Example 3 (Thin-film Capacitor: an example in which each electrode with the second polarity of first capacitative elements is connected to adjacent one electrode with the second polarity of second capacitative elements via an individual connection hole)

8. Fifth Embodiment (Thin-film Capacitor: an example in which plural first capacitative elements and plural second capacitative elements are stacked)

9. Sixth Embodiment (Multilayer Wiring Board: an example of a multilayer wiring board containing a thin film capacitor)

10. Seventh Embodiment (Multilayer Wiring Board: an example of an interposer board containing a thin film capacitor)

11. Eighth Embodiment (Multilayer Wiring Board: an example in which interposer boards are multilayered)

12. Ninth Embodiment (Semiconductor Device: an example using a multilayer wiring board as a mother board)

First Embodiment

Figure 1A:
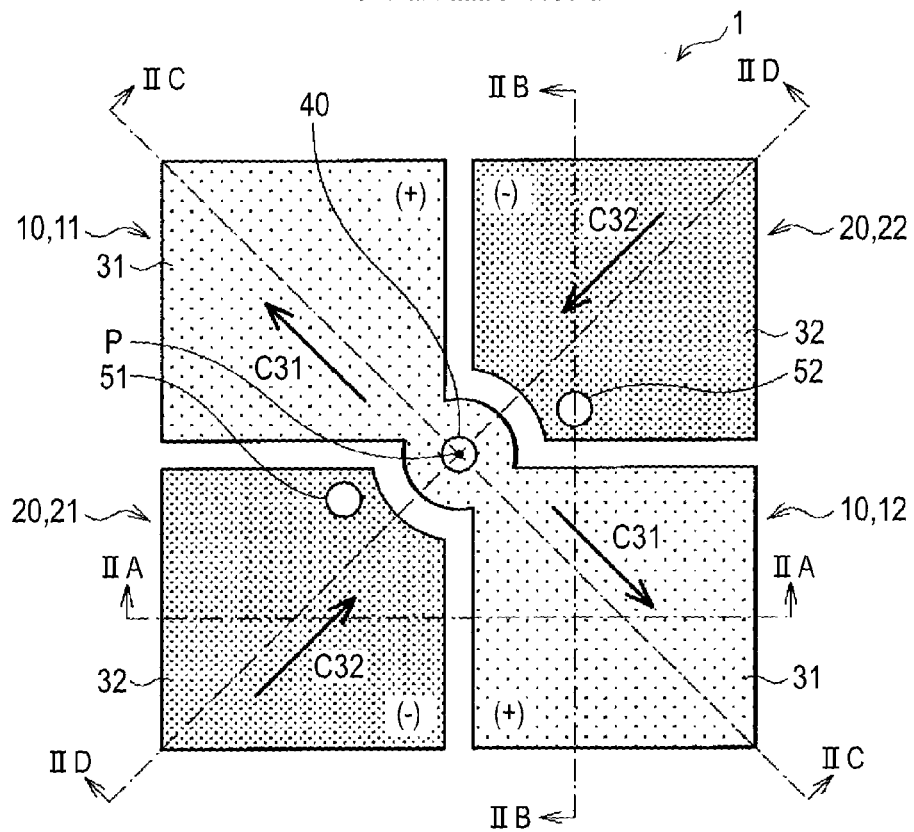
FIGS. 1A and 1B are plan views showing a configuration of a thin-film capacitor according to the first embodiment of the present disclosure as seen from an upper surface side and a lower surface side of a dielectric layer, respectively.
Figure 1B:
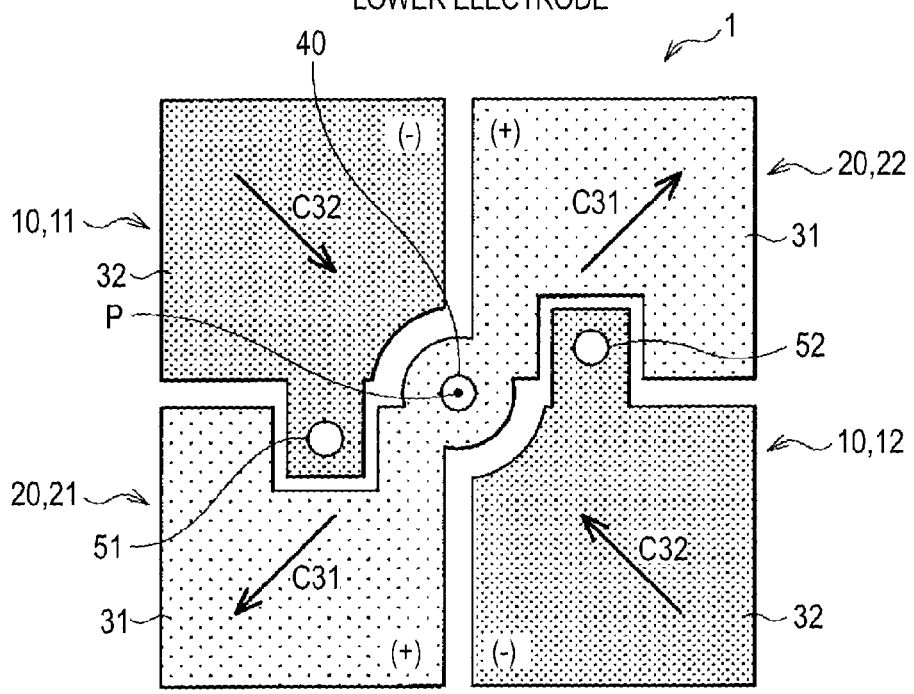

FIGS. 1A and 1B show a planar configuration of a thin-film capacitor according to the first embodiment of the present disclosure, and FIGS. 2A to 2D show a sectional configuration of the thin-film capacitor shown in FIGS. 1A and 1B. The thin-film capacitor 1 is built in a multilayer wiring board such as a printed wiring board or an interposer board and used as a decoupling capacitor. The thin-film capacitor 1 has a configuration in which plural first capacitive elements 11, (hereinafter, collectively referred to as "first capacitive elements 10") and plural second capacitive elements 21, 22 (hereinafter, collectively referred to as "second capacitive elements 20") are arranged around a specific position P, for example.

The first capacitive elements 10 and the second capacitive elements 20 have quadrangular shapes (square shapes) with the same dimensions, for example. The first capacitive element 10 has a first electrode layer 31 with a first polarity (e.g., positive) on an upper surface of a dielectric layer 30 and a second electrode layer 32 with a second polarity (e.g., negative) on a lower surface of the dielectric layer 30. The second capacitive element 20 has a second electrode layer 32 with a second polarity (e.g., negative) on the upper surface of the dielectric layer 30 and a first electrode layer 31 with a first polarity (e.g., positive) on the lower surface of the dielectric layer 30.

The first electrode layer 31 and the second electrode layer 32 include conducting layers of copper (Cu) or the like, for example. As a constituent material of the dielectric layer 30, for example, $SiO_2$, $Si_3N_4$, $Al_2O_3$, $HfO_2$, $ZrO_2$, $Ta_2O_5$, STO ($SrTiO_3$), BTO ($BaTiO_3$), BST (BaSrTiO), or the like is cited and its relative permittivity is 4 to 1000. When the thin-film capacitor 1 is built in the printed wiring board using the material, the thickness of the dielectric layer 30 is desirably about 20 nm to 1000 nm, for example.

The direction of a current C31 flowing in the first electrode layer 31 is a direction from the specific position P toward outside and the direction of a current C32 flowing in the second electrode layer 32 is a direction from outside toward the specific position P. Accordingly, in the individual first capacitive elements 10 and second capacitive elements 20, the direction of the current flowing in the first electrode layer 31 and the direction of the current flowing in the second electrode layer 32 are opposite and generated inductances may be cancelled out and made smaller.

The first capacitive elements 10 and the second capacitive elements 20 are provided in the same number (two each in FIGS. 1A and 1B, for example). In other words, the thin-film capacitor 1 has plural pairs of the first capacitive elements 10 and the second capacitive elements 20 (e.g., two in FIGS. 1A and 1B).

The first capacitive elements 10 are arranged around the specific position P with spaces. The second capacitive elements 20 are arranged around the specific position P in the spaced parts between the first capacitive elements 11, 12. Therefore, the first capacitive elements 11, 12 and the second capacitive elements 21, 22 are arranged alternately and adjacently around the specific position P. That is, in the planar arrangement, the first electrode layers 31 and the second electrode layers 32 having different polarities are inevitably adjacent.

Using the alternate arrangement of the first capacitive elements 10 and the second capacitive elements 20 around the specific position P, the directions of the currents C31 and C32 are opposite in the parts in which the first electrode layers 31 and the second electrode layers 32 are adjacent and generated electromagnetic fields are cancelled out, and the inductance may be made smaller. Further, the first electrode layer 31 (e.g., a VDD electrode) and the second electrode layer 32 (e.g., a Vss (GND) electrode) may be provided in the same layer. Accordingly, the VDD wiring and the GND wiring (not shown) from the terminals of a semiconductor device (not shown) may be made shorter and the ESL may be made smaller.

All first electrode layers 31 of the plural first capacitive elements 10 and all second electrode layers 32 of the plural second capacitive elements 20 are connected via a single common connection hole 40 provided in the specific position P and penetrating the thin-film capacitor 1 in the stacking direction. Thereby, in the thin-film capacitor 1, reduction in effective electrode area may be suppressed and downsizing may be realized.

The second electrode layer 32 of the upper left first capacitive element 11 is connected to the second electrode layer 32 of the adjacent lower left second capacitive element 21 via an individual connection hole 51. The second electrode layer 32 of the lower right first capacitive element 12 is connected to the second electrode layer 32 of the adjacent upper right second capacitive element 22 via an individual connection hole 52. The individual connection holes 51, 52 are via holes penetrating the thin-film capacitor 1 in the stacking direction around the common connection hole 40. The individual connection hole 51 connects the second electrode layers 32 of the adjacent pair of the first capacitive element 11 and the second capacitive element 21, and the individual connection hole 52 connects the second electrode layers 32 of the adjacent pair of the first capacitive element 12 and the second capacitive element 22.

Figure 2A:
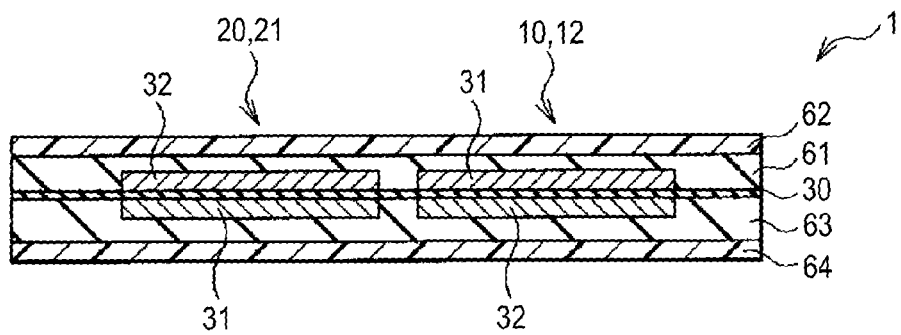
FIGS. 2A to 2D show sectional views along IIA-IIA line, IIB-IIB line, IIC-IIC line, and IID-IID line in FIG. 1A.
Figure 2B:
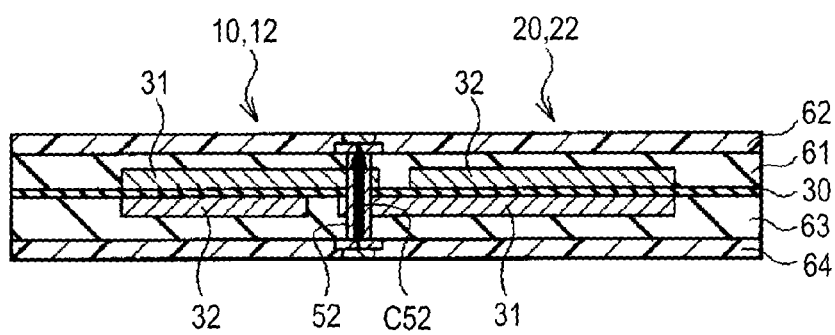
Figure 2C:
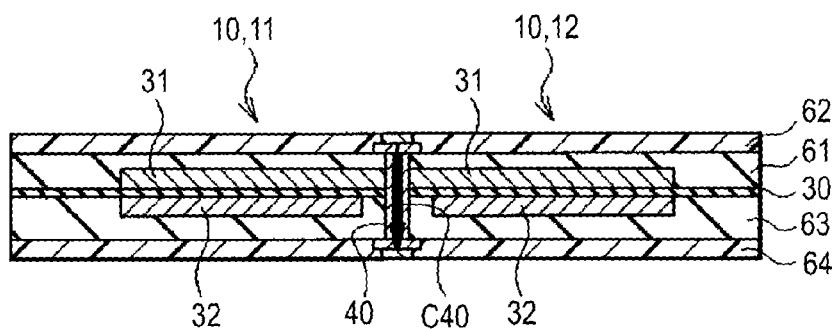
Figure 2D:
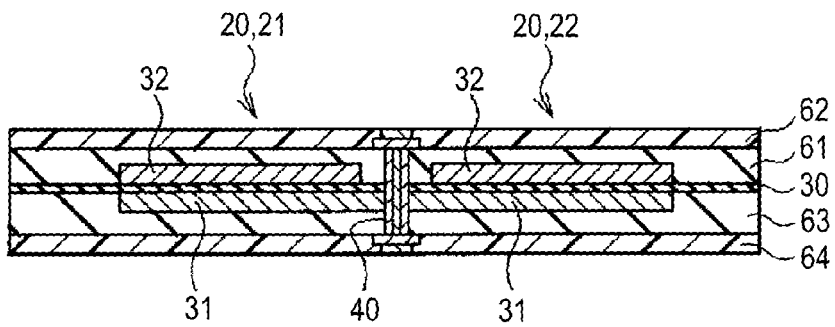

The direction of a current C40 flowing in the common connection hole 40 is downward in the stacking direction as shown in FIG. 2C. The directions of currents C51, C52 flowing in the individual connection holes 51, 52 are upward in the stacking direction as shown in FIG. 2B. That is, the direction of the current C40 flowing in the common connection hole 40 and the directions of the currents C51, C52 flowing in the individual connection holes 51, 52 are opposite. Therefore, the magnetic field formed by the current channel within the common connection hole 40 may be cancelled and reduced by the magnetic fields formed by the current channels within the individual connection holes 51, 52, and generated inductances may be cancelled out and made smaller.

It is desirable that the individual connection holes 51, 52 are arranged closer to the common connection hole 40. Specifically, by arranging the individual connection holes 51, 52 as closer to the common connection hole 40 as possible in an allowable range according to the design rules, the above described inductance reduction effect may be more improved.

Further, it is preferable that the individual connection holes 51, 52 are isotropically arranged around the common connection hole 40. Here, "isotropically" refers to arrangement at the equal distance (including nearly equal distances with slight differences) from the specific position P, i.e., the common connection hole 40. Thereby, the above described inductance reduction effect may be more improved. In addition, it is more desirable that the holes are arranged at equal intervals (including nearly equal intervals) in the circumferential direction around the specific position P.

On the upper surface of the thin-film capacitor 1, an insulating base material 61 and a solder resist layer 62 as a protective layer are provided in this order from the side of the thin-film capacitor 1. On the lower surface of the thin-film capacitor 1, similarly, an insulating base material 63 and a solder resist layer 64 as a protective layer are provided in this order from the side of the thin-film capacitor 1. The insulating base materials 61, 63 include sheet-like members formed by impregnating a glass cloth with an insulating resin such as an epoxy resin, a polyimide resin, or a BT resin. In the upper end parts and the lower end parts of the common connection hole 40 and the individual connection holes 51, 52, electrode terminals (wiring layers) are provided and the solder resist layers 62, 64 are opened and pads are provided therein.

The thin-film capacitor 1 having the above described configuration may be manufactured using a technology of a buildup method or the like, for example.

In the thin-film capacitor 1, when signal voltages are applied to the respective terminals (not shown) of the first capacitative elements 10 and the second capacitative elements 20, the currents C31 flow in the direction from the specific position P toward outside in the first electrode layers 31 and the currents C32 flow in the direction from outside toward the specific position P in the second electrode layers 32 as shown in FIGS. 1A and 1B. That is, in the individual first capacitative elements 10 and second capacitative elements 20, the direction of the current flowing in the first electrode layer 31 and the direction of the current flowing in the second electrode layer 32 are opposite. Therefore, the magnetic field formed by the current channel within the first electrode layer 31 is cancelled and reduced by the magnetic field formed by the current channel within the second electrode layer 32, and generated inductances are cancelled out and reduced.

Further, the first capacitative elements 10 and the second capacitative elements 20 are alternately arranged around the specific position P, and thus, the directions of the currents C31 and C32 are opposite in the parts in which the first electrode layers 31 and the second electrode layers 32 are adjacent, and generated electromagnetic fields are cancelled out and the inductance may become smaller.

Furthermore, the current C40 flows in the common connection hole 40 downward in the stacking direction as shown in FIG. 2C. The currents C51, C52 flow in the individual connection holes 51, 52 upward in the stacking direction as shown in FIG. 2B. That is, the direction of the current C40 flowing in the common connection hole 40 and the directions of currents C51, C52 flowing in the individual connection holes 51, 52 are opposite. Therefore, the magnetic field formed by the current channel within the common connection hole 40 may be cancelled and reduced by the magnetic fields formed by the current channels within the individual connection holes 51, 52, and generated inductances may be cancelled out and become smaller.

As described above, in the embodiment, the first capacitative elements 10 and the second capacitative elements 20 are alternately arranged around the specific position P, and thus, the directions of the currents C31 and C32 are opposite in the parts in which the first electrode layers 31 and the second electrode layers 32 are adjacent, and generated electromagnetic fields are cancelled out and the inductance may be made smaller. Further, all first electrode layers 31 of the plural first capacitative elements 10 and all second electrode layers 32 of the second capacitative elements 20 are connected via the single common connection hole 40, and thus, the number of connection holes is reduced, and reduction in effective electrode area may be suppressed and downsizing may be realized.

Note that, in the embodiment, the case where the first electrode layers 31 have the positive polarity and the second electrode layers 32 have the negative polarity has been shown for explanation, however, the opposite is equal.

Modified Example 1

In the embodiment, the case where the first capacitative elements 10 and the second capacitative elements 20 have quadrangular shapes (square shapes) has been explained, however, the first capacitative elements 10 and the second capacitative elements 20 may have other planar shapes such as triangular shapes shown in FIGS. 3A and 3B.

Further, in the embodiment, the case where two of the first capacitative elements 10 and the second capacitative elements 20, four capacitative elements in total are provided has been explained, however, the number of the first capacitative elements 10 and the second capacitative elements 20 is not limited, three of them or more may be provided.

Second Embodiment

FIGS. 4A and 4B show a planar configuration of a thin-film capacitor according to the second embodiment of the present disclosure. In the thin-film capacitor 2, all second electrode layers 32 of the plural first capacitative elements 10 and all second electrode layers 32 of the second capacitative elements 20 are connected via plural individual connection holes 51, 52, 53, 54. Thereby, in the thin-film capacitor 2, the number of the individual connection holes 51 to 54 as lead terminals of the second electrode layers 32 may be increased and the degree of freedom of layout of the individual connection holes 51 to 54 may be secured. Further, the individual connection holes 51 to 54 are provided to surround the common connection hole 40, and the induction may be reduced. Except that, the embodiment has the same configuration, operation, and advantage as those of the first embodiment, and may be manufactured in the same manner as that of the first embodiment.

The individual connection holes 53, 54 are via holes penetrating the thin-film capacitor 1 in the stacking direction around the common connection hole 40 like the individual connection holes 51, 52. The individual connection hole 53 connects the second electrode layer 32 of the lower left second capacitative element 21 and the second electrode layer 32 of the adjacent lower right first capacitative element 12. The individual connection hole 54 connects the second electrode layer 32 of the upper right second capacitative element 22 and the second electrode layer 32 of the adjacent upper left first capacitative element 11. The individual connection hole 53 connects the second electrode layers 32 of the pair of adjacent first capacitative element 12 and second capacitative element 21, and the individual connection hole 54 connects the second electrode layers 32 of the pair of adjacent first capacitative element 11 and second capacitative element 22. Therefore, the second electrode layers 32 of all first capacitative elements 10 and second capacitative elements 20 are connected by the individual connection holes 51, 52, 53, 54.

It is desirable that the individual connection holes 51 to 54 are arranged closer to the common connection hole 40. Specifically, by arranging the individual connection holes 51 to 54 as closer to the common connection hole 40 as possible in an allowable range according to the design rules, the above described inductance reduction effect may be more improved.

Further, it is preferable that the individual connection holes 51 to 54 are isotropically arranged around the common connection hole 40. Here, "isotropically" refers to arrangement at the equal distance (including nearly equal distances with slight differences) from the specific position P, i.e., the common connection hole 40. Thereby, the above described inductance reduction effect may be more improved. In addition, it is more desirable that the holes are arranged at equal intervals (including nearly equal intervals) in the circumferential direction around the specific position P.

Modified Example 2

In the embodiment, the case where the first capacitative elements 10 and the second capacitative elements 20 have quadrangular shapes (square shapes) has been explained, however, the first capacitative elements 10 and the second capacitative elements 20 may have other planar shapes such as triangular shapes shown in FIGS. 5A and 5B.

Third Embodiment

FIGS. 6A and 6B show a planar configuration of a thin-film capacitor according to the third embodiment of the present disclosure. In the thin-film capacitor 3, all areas of the first capacitative elements 10 and the second capacitative elements 20 are different, and accordingly, all capacities of the first capacitative elements 10 and the second capacitative elements 20 are different. Except that, the embodiment has the same configuration, operation, and advantage as those of the first and second embodiment, and may be manufactured in the same manner as that of the first and second embodiment.

Figure 7:
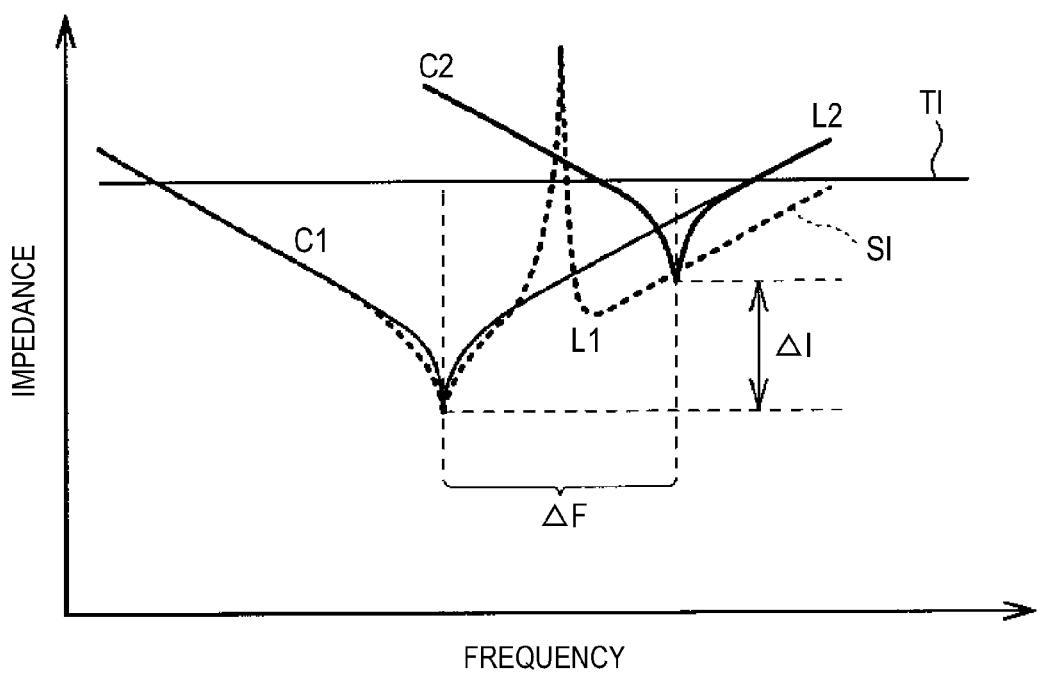
FIG. 7 shows a synthetic impedance when a capacitive element with larger capacity and a capacitive element with smaller capacity are parallel-connected.

FIG. 7 shows a synthetic impedance when a capacitative element C1 with larger capacity and a capacitative element C2 with smaller capacity are parallel-connected. The capacitative elements C1, C2 behave as an LC parallel resonance circuit in a specific frequency region ΔF, a synthetic impedance SI becomes extremely higher at a certain frequency (antiresonance) and may exceed a target impedance TI. The antiresonance becomes larger as the difference ΔI between the minimum values of the respective capacitative elements C1, C2 is larger. Accordingly, to suppress the antiresonance, the antiresonance is relaxed further using a third capacitative element C3 having a different capacity.

Figure 8:
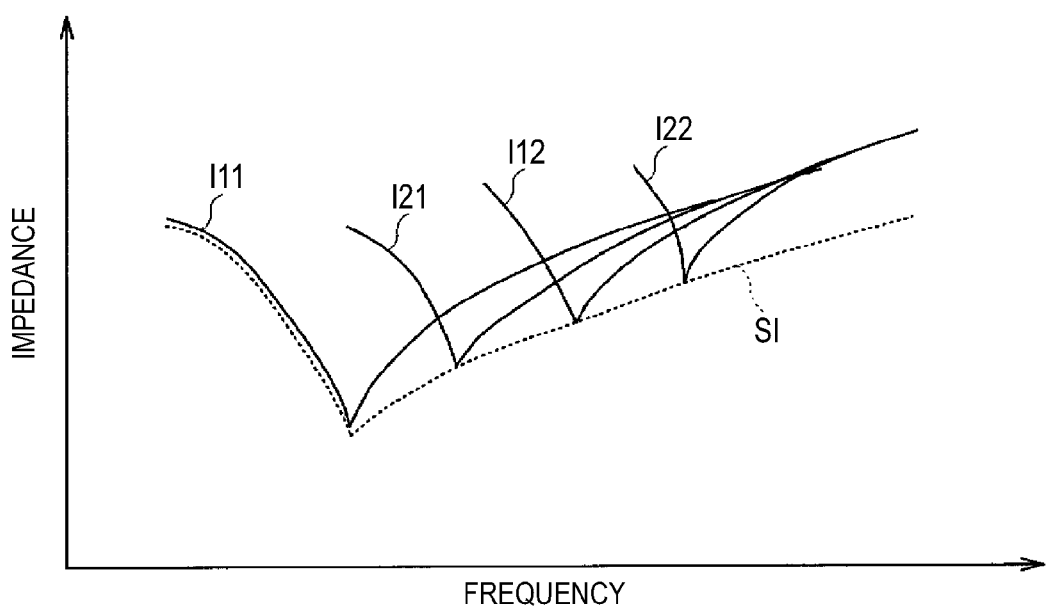
FIG. 8 schematically shows a synthetic impedance of four capacitive elements shown in FIGS. 6A and 6B.

In the embodiment, as shown in FIG. 8, two first capacitative elements 10 and two second capacitative elements 20 having different areas (capacities) are parallel-connected. Accordingly, their respective impedances I11, I12, I21, I22 are synthesized, and thereby, antiresonance may be suppressed and the synthetic impedance SI from the lower frequency side to the higher frequency side may be reduced. Therefore, the impedance may be made lower in the wider range and the decoupling effect may be effectively exerted.

Note that, in the embodiment, the case where all areas (capacities) of the first capacitative elements 10 and the second capacitative elements 20 are different has been explained, however, it is necessary that the area of at least one of the plural first capacitative elements 10 and the plural second capacitative elements 20 is different from the other areas.

Fourth Embodiment

FIGS. 9A and 9B show a planar configuration of a thin-film capacitor according to the fourth embodiment of the present disclosure. In the thin-film capacitor 4, the plural first capacitative elements 10 and the plural second capacitative elements 20 respectively have sector shapes and entirely form a circular shape, and all center angles (areas, capacities) of the first capacitative elements 10 and the second capacitative elements 20 are different. Thereby, in the embodiment, the areas or the capacities of the first capacitative elements 10 and the second capacitative elements 20 may be adjusted by the center angles of the sector shapes, and reduction in effective area (or increase in ineffective area) due to irregular shapes may be suppressed. Except that, the embodiment has the same configuration, operation, and advantage as those of the first to third embodiment, and may be manufactured in the same manner as that of the first to third embodiment.

Note that, in the embodiment, the case where all center angles (areas, capacities) of the first capacitative elements 10 and the second capacitative elements 20 are different has been explained, however, it is necessary that the center angle of at least one of the plural first capacitative elements 10 and the plural second capacitative elements 20 is different from the other center angles.

Modified Example 3

Further, in the embodiment, like in the second embodiment, the case where all second electrode layers 32 of the plural first capacitative elements 10 and all second electrode layers 32 of the second capacitative elements 20 are connected via the plural individual connection holes 51 to 54 has been explained. However, as shown in FIGS. 10A and 10B, as is the case of the first embodiment, only the individual connection holes 51, 52 may be provided. In this case, the individual connection hole 51 connects the second electrode layers 32 of the adjacent pair of the first capacitative element 11 and the second capacitative element 21, and the individual connection hole 52 connects the second electrode layers 32 of the adjacent pair of the first capacitative element 12 and the second capacitative element 22.

Fifth Embodiment

Figure 11:
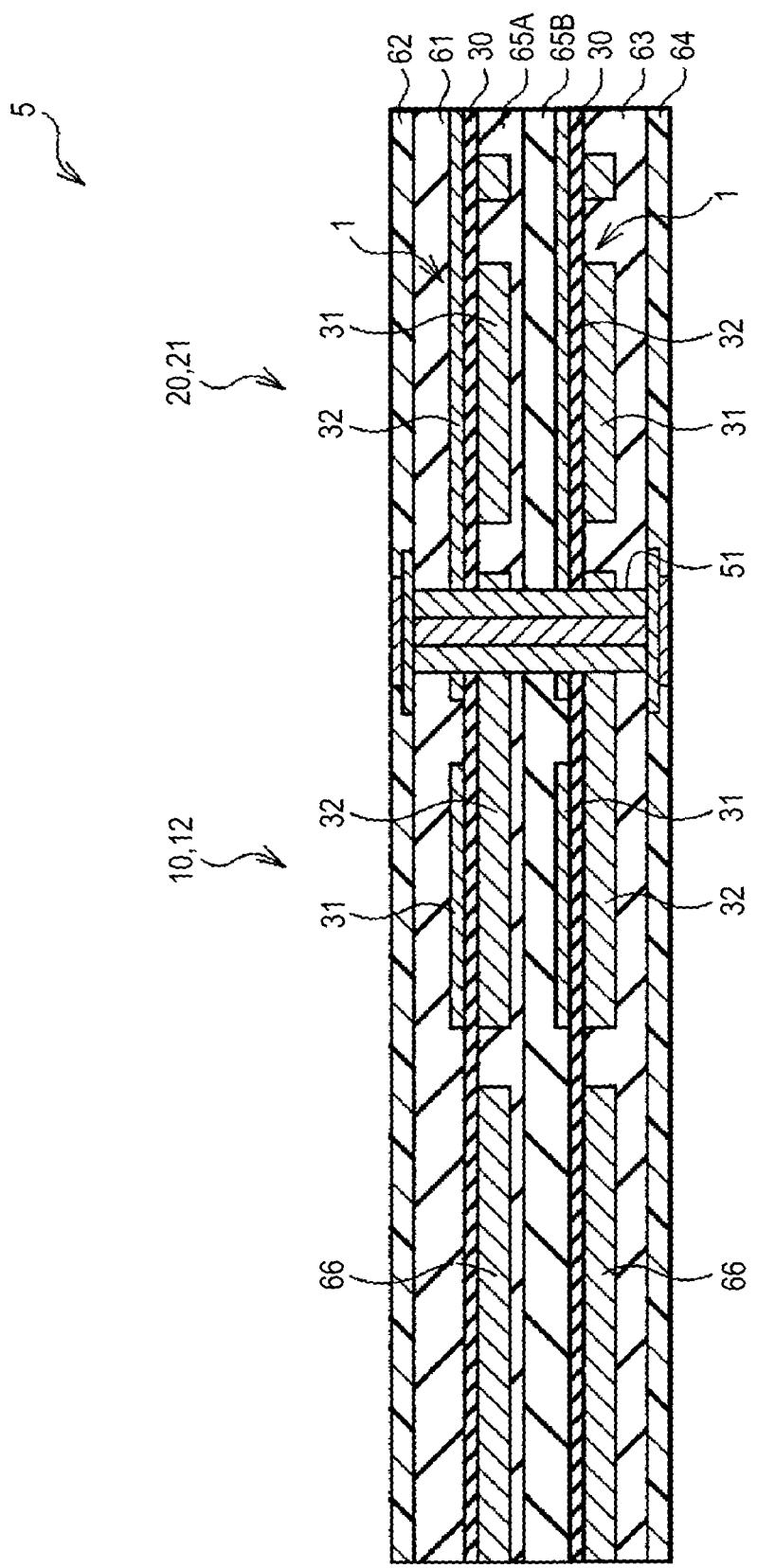
FIG. 11 is a sectional view showing a configuration of a thin-film capacitor according to the fifth embodiment of the present disclosure.

FIGS. 11A and 11B show a planar configuration of a thin-film capacitor according to the fifth embodiment of the present disclosure. In the thin-film capacitor 5, the thin-film capacitors 1 each including the first capacitative elements 10 and the second capacitative elements 20 of the first embodiment are stacked in plural layers (e.g., two layers in FIGS. 11A and 11B) to increase the capacity per unit area. Except that, the embodiment has the same configuration, operation, and advantage as those of the first to third embodiment, and may be manufactured in the same manner as that of the first to third embodiment.

Between the stacked thin-film capacitors 1, for example, insulating base materials 65A, 65B are provided. Further, in the same layer of each thin-film capacitor 1, a wiring layer 66 including the same layer as the first electrode layer 31 or the second electrode layer 32 may be provided. The wiring layer 66 is a residual of the film used for formation of the first electrode layer 31 or the second electrode layer 32.

Note that, in the embodiment, the case where plural layers of the thin-film capacitors 1 of the first embodiment are stacked has been explained, however, obviously, plural layers of the thin-film capacitors 2 to 4 of the second to fourth embodiments may be stacked.

Sixth Embodiment

Figure 12:
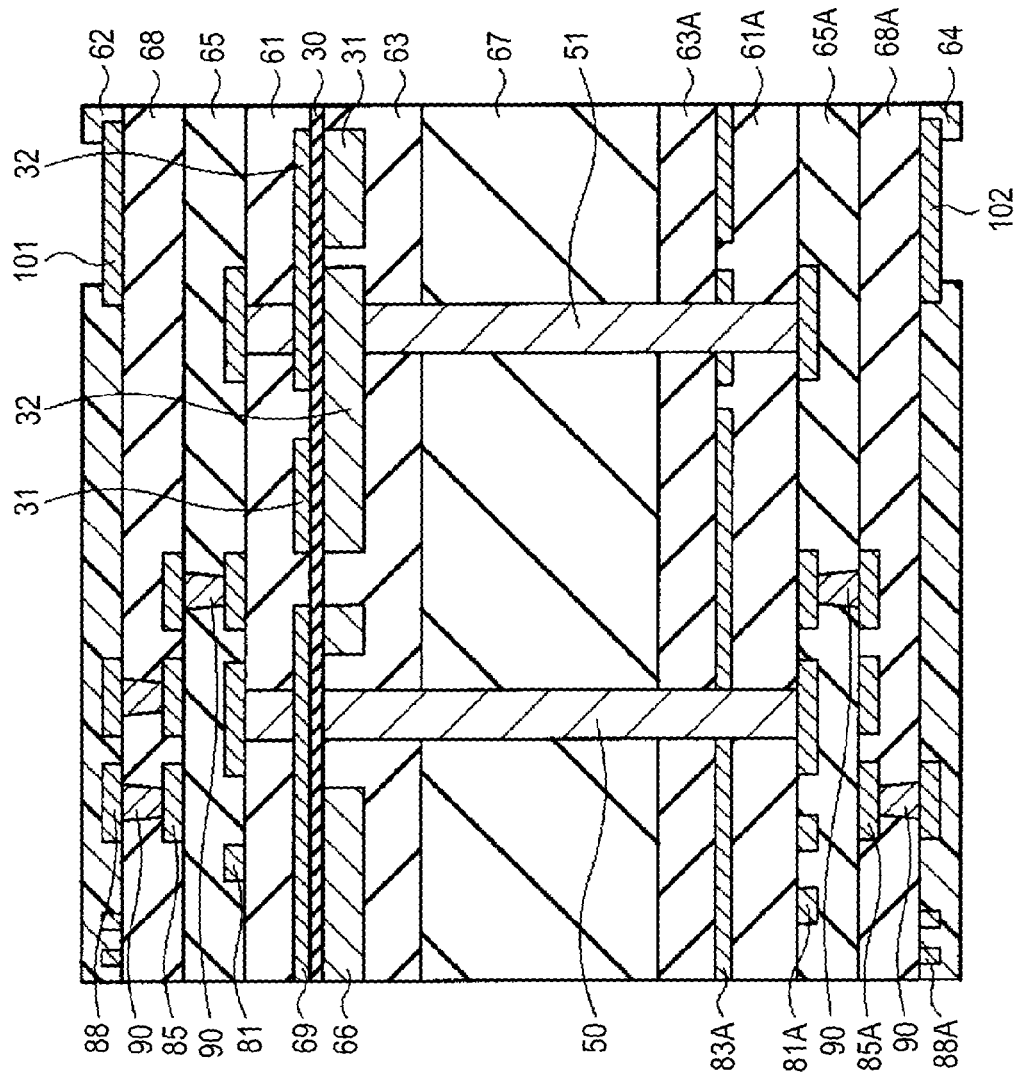
FIG. 12 is a sectional view showing a configuration of a multilayer wiring board according to the sixth embodiment of the present disclosure.

FIG. 12 shows a sectional configuration of a multilayer wiring board 6 according to the sixth embodiment of the present disclosure. The multilayer wiring board 6 is a printed wiring board containing the thin-film capacitor 1 of the first embodiment, for example. The multilayer wiring board 6 has a resin substrate 67 of a core layer (insulating resin layer) and prepregs (insulating resins) 63, 61, 65, 68, 63A, 61A, 65A, 68A. On the respective surfaces of the prepregs 63, 61, 65, 68, 63A, 61A, 65A, 68A, patterned wiring layers 81, 85, 88, 83A, 81A, 85A, 88A are provided. The wiring layers 85, 88, 81A, 85A, 88A are connected by vias 90 provided by laser or the like. The solder resist layers 62, 64 as protective films are provided on the wiring layers 88, 88A and connection pads 101, 102 are opened.

The thin-film capacitor 1 is embedded between the prepreg 63 and the prepreg 61, and the first electrode layer 31 and the second electrode layer 32 are connected to the wiring layers 81, 81A via the individual connection hole 51 (and the common connection hole 40 (not shown) or the like). In the same layer as the thin-film capacitor 1, the wiring layers 66, 69 having the same layer configuration as those of the first electrode layer 31 and the second electrode layer 32 may be provided. The wiring layers 66, 69 are residuals of the film used for formation of the first electrode layer 31 or the second electrode layer 32.

The multilayer wiring board 6 may be manufactured using a technology of a buildup method or the like, for example.

In the embodiment, the thin-film capacitor 1 is built in the multilayer wiring board 6, and thus, the degree of freedom of layout may be increased by downsizing of the thin-film capacitor 1, and downsizing of the multilayer wiring board 6 may be realized.

Note that, in the embodiment, the case where the thin-film capacitor 1 of the first embodiment is built in the multilayer wiring board 6 has been explained, however, obviously, the thin-film capacitors 2 to 4 of the second to fourth embodiments may be built in the multilayer wiring board 6.

Seventh Embodiment

Figure 13:
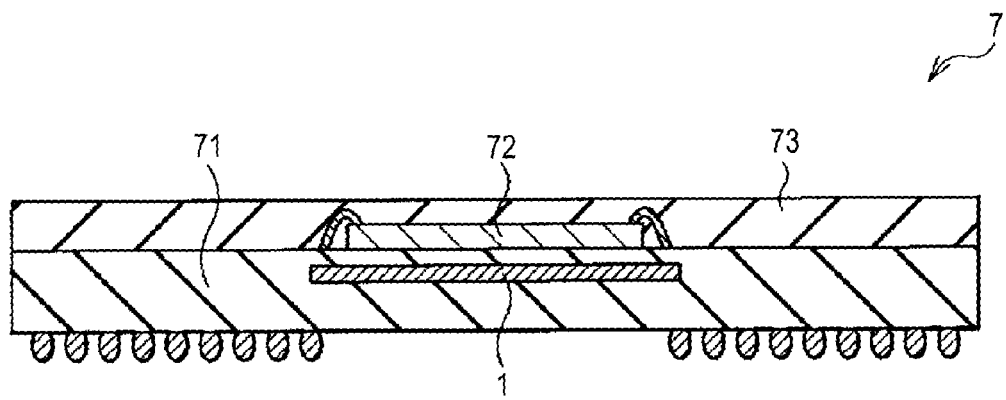
FIG. 13 is a sectional view showing a configuration of a multilayer wiring board according to the seventh embodiment of the present disclosure.

FIG. 13 shows a sectional configuration of a multilayer wiring board 7 according to the seventh embodiment of the present disclosure. The multilayer wiring board 7 is used as an interposer board, for example, and has a board main part 71 containing the thin-film capacitor 1 of the first embodiment. The board main part 71 has a structure of the multilayer wiring board containing the thin-film capacitor 1 like the sixth embodiment, for example.

A semiconductor element 72 is mounted on the upper surface of the board main part 71, wire-bonded to the connection pad 101 shown in FIG. 12, and covered by a molded resin 73. Further, on the lower surface of the board main part 71, a solder bump for connection to a mother board or the like is provided on the connection pad 102 shown in FIG. 12.

Figure 14:
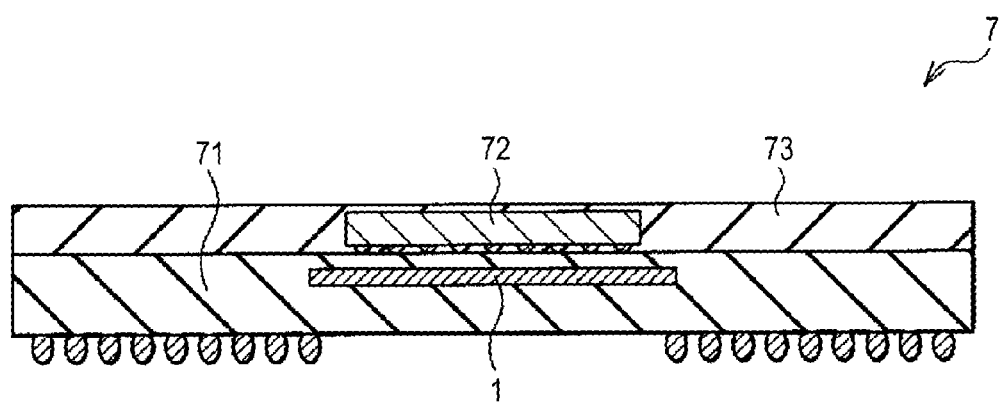
FIG. 14 is a sectional view showing a modified example of the multilayer wiring board shown in FIG. 13.

Further, as shown in FIG. 14, the semiconductor element 72 may be mounted by bump connection using a ball grid array or the like.

The multilayer wiring board 7 may be manufactured using a technology of a buildup method or the like, for example.

In the embodiment, the interposer board is formed by building the thin-film capacitor 1 in the board main part 71 of the multilayer wiring board 7, and thus, as is the case of the sixth embodiment, the degree of freedom of layout may be increased by downsizing of the thin-film capacitor 1, and downsizing of the multilayer wiring board 7 may be realized. Further, the wiring distance between the semiconductor element 72 or the IC chip 74 and the thin-film capacitor 1 may be made shorter, and the inductance as seen from the multilayer wiring board 7 may be reduced.

Note that, in the embodiment, the case where the thin-film capacitor 1 of the first embodiment is built in the board main part 71 of the multilayer wiring board 7 has been explained, however, obviously, the thin-film capacitors 2 to 4 of the second to fourth embodiments may be built in the board main part 71 of the multilayer wiring board 7.

Eighth Embodiment

Figure 15:
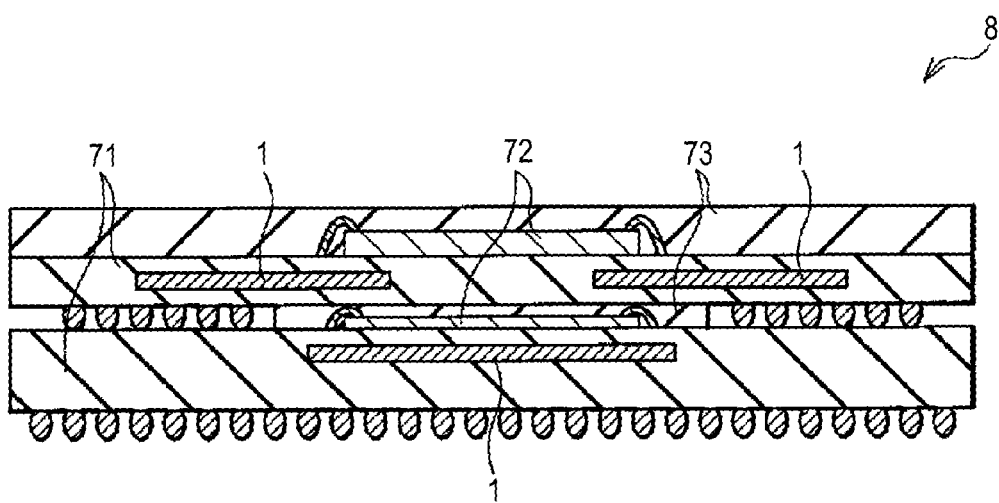
FIG. 15 is a sectional view showing a configuration of a multilayer wiring board according to the eighth embodiment of the present disclosure.

FIG. 15 shows a sectional configuration of a multilayer wiring board according to the eighth embodiment of the present disclosure. The multilayer wiring board 8 is an interposer board having a multilayered structure called PoP (package on package), and has a configuration in which plural (e.g., two in FIG. 15) multilayer wiring boards 7 according to the seventh embodiment are stacked.

In the embodiment, the wiring distance between the semiconductor element 72 and the thin-film capacitor 1 embedded in the board main part 71 of the multilayer wiring board 7 may be made shorter, and the inductance of the entire package as seen from the semiconductor element 72 may be reduced. Especially, the embodiment is particularly effective for the multilayer wiring board 7 provided in the upper part of the multilayered structure called PoP.

Note that, in the embodiment, the case where the thin-film capacitor 1 of the first embodiment is built in the board main part 71 of the multilayer wiring board 7 has been explained, however, obviously, the thin-film capacitors 2 to 4 of the second to fourth embodiments may be built in the board main part 71 of the multilayer wiring board 7.

Ninth Embodiment

Figure 16:
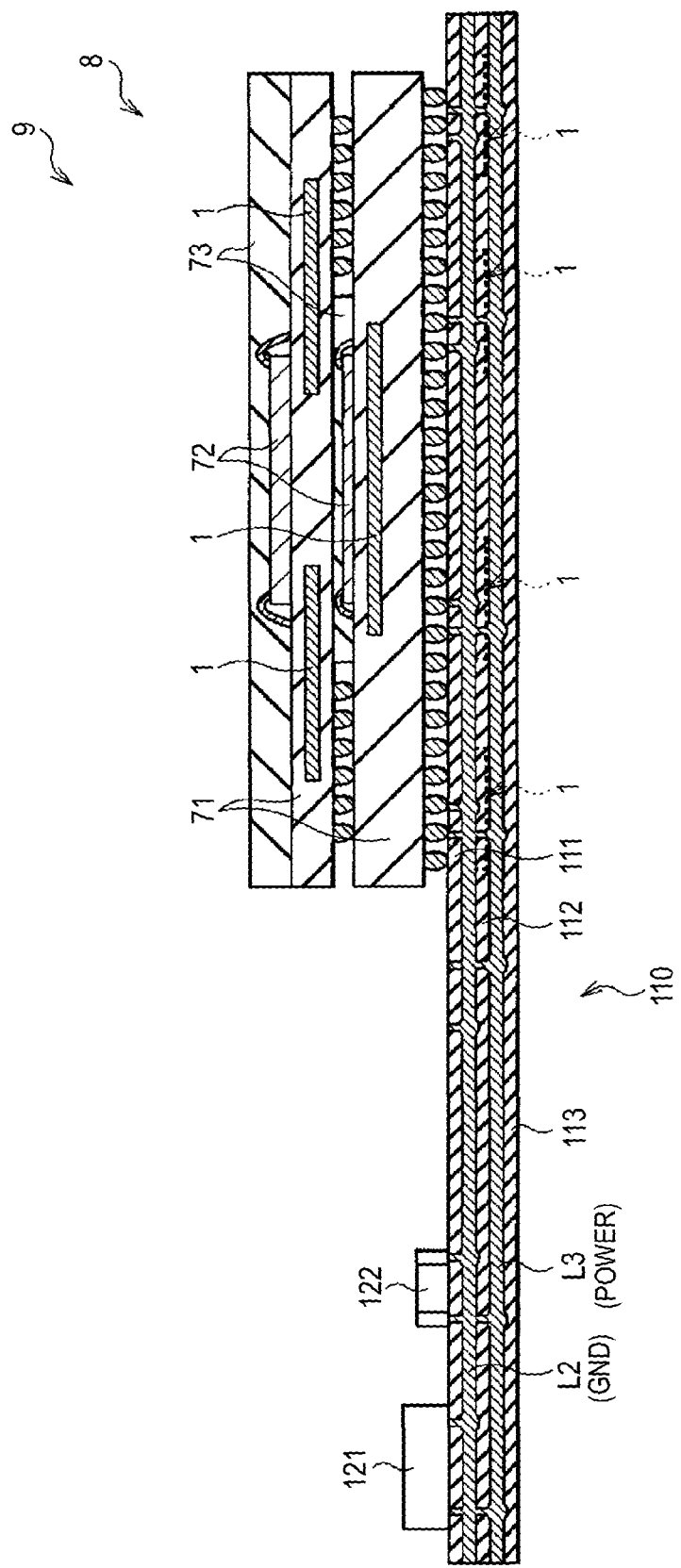
FIG. 16 is a sectional view showing a configuration of a multilayer wiring board according to the ninth embodiment of the present disclosure.

FIG. 16 shows a configuration of a semiconductor device according to the ninth embodiment of the present disclosure. The semiconductor device 9 includes a DC/DC power supply circuit 121, a bulk chip 122, and the multilayer wiring board 8 according to the eighth embodiment as an interposer board mounted on a mother board 110, for example. The mother board 110 is a printed wiring board having configuration in which a first wiring layer L1 (not shown), a second wiring layer (GND) L2, a third wiring layer (power supply wiring) L3, and a fourth wiring layer L4 (not shown) are stacked with resin layers 111, 112, 113 in between. In the mother board 110, the second wiring layer (GND) L2 and the third wiring layer (power supply wiring) L3 and the resin layer 112 between them form the thin-film capacitor 1 according to the first embodiment.

In the embodiment, the thin-film capacitor 1 is built in the mother board 110, and thus, the wiring distance between the semiconductor element 72 and the thin-film capacitor 1 may be made shorter, and the inductance as seen from the semiconductor device 9 may be reduced.

As above, the present disclosure has been explained by citing the embodiments, and the present disclosure is not limited to the embodiments, but various modifications may be made.

For example, in the embodiments, the explanation has been made by specifically citing the configuration of the thin-film capacitor, the multilayer wiring board, or the semiconductor device, however, it is not necessary to include all component elements and other component elements may be further included.

Note that the technology according to the present disclosure may be implemented as the following configurations.

(1) A thin-film capacitor including:
plural first capacitative elements each having an electrode layer with a first polarity on an upper surface of a dielectric layer and an electrode layer with a second polarity on a lower surface of the dielectric layer and arranged around a specific position;
plural second capacitative elements each having an electrode layer with the second polarity on the upper surface of the dielectric layer and an electrode layer with the first polarity on the lower surface of the dielectric layer and arranged around the specific position alternately with the plural first capacitative elements;
a single common connection hole provided in the specific position and connecting all electrode layers with the first polarity of the plural first capacitative elements and all electrode layers with the first polarity of the plural second capacitative elements; and
plural individual connection holes provided around the common connection hole and connecting each electrode layer with the second polarity of the plural first capacitative elements to the adjacent electrode layer with the second polarity of the plural second capacitative elements.

(2) The thin-film capacitor according to (1), wherein the plural individual connection holes are isotropically arranged around the common connection hole.

(3) The thin-film capacitor according to (1) or (2), wherein all electrode layers with the second polarity of the plural first capacitative elements and all electrode layers with the second polarity of the plural second capacitative elements are connected by the plural individual connection holes.

(4) The thin-film capacitor according to any one of (1) to (3), wherein at least one of the plural first capacitative elements and the plural second capacitative elements has an area different from areas of others.

(5) The thin-film capacitor according to any one of (1) to (4), wherein the plural first capacitative elements and the plural second capacitative elements each has a sector shape and entirely form a circular shape.

(6) The thin-film capacitor according to (5), wherein at least one of the plural first capacitative elements and the plural second capacitative elements has an center angle different from center angles of others.

(7) The thin-film capacitor according to any one of (1) to (6), wherein the plural first capacitative elements and the plural second capacitative elements are stacked in multiple layers.

(8) A multilayer wiring board including a thin-film capacitor,
the thin-film capacitor including:
plural first capacitative elements each having an electrode layer with a first polarity on an upper surface of a dielectric layer and an electrode layer with a second polarity on a lower surface of the dielectric layer and arranged around a specific position;
plural second capacitative elements each having an electrode layer with the second polarity on the upper surface of the dielectric layer and an electrode layer with the first polarity on the lower surface of the dielectric layer and arranged around the specific position alternately with the plural first capacitative elements;
a single common connection hole provided in the specific position and connecting all electrode layers with the first polarity of the plural first capacitative elements and all electrode layers with the first polarity of the plural second capacitative elements; and
plural individual connection holes provided around the common connection hole and connecting each electrode layer with the second polarity of the plural first capacitative elements to the adjacent electrode layer with the second polarity of the plural second capacitative elements.

(9) A semiconductor device including a chip and a multilayer wiring board,
the thin-film capacitor including:
plural first capacitative elements each having an electrode layer with a first polarity on an upper surface of a dielectric layer and an electrode layer with a second polarity on a lower surface of the dielectric layer and arranged around a specific position;
plural second capacitative elements each having an electrode layer with the second polarity on the upper surface of the dielectric layer and an electrode layer with the first polarity on the lower surface of the dielectric layer and arranged around the specific position alternately with the plural first capacitative elements;
a single common connection hole provided in the specific position and connecting all electrode layers with the first polarity of the plural first capacitative elements and all electrode layers with the first polarity of the plural second capacitative elements; and
plural individual connection holes provided around the common connection hole and connecting each electrode layer with the second polarity of the plural first capacitative elements to the adjacent electrode layer with the second polarity of the plural second capacitative elements.

The present disclosure contains subject matter related to that disclosed in Japanese Priority Patent Application JP 2011-139836 filed in the Japan Patent Office on Jun. 23, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A thin-film capacitor comprising:
plural first capacitative elements each having an electrode layer with a first polarity on an upper surface of a dielectric layer and an electrode layer with a second polarity on a lower surface of the dielectric layer and arranged around a specific position;
plural second capacitative elements each having an electrode layer with the second polarity on the upper surface of the dielectric layer and an electrode layer with the first polarity on the lower surface of the dielectric layer and arranged around the specific position alternately with the plural first capacitative elements;
a single common connection hole provided in the specific position and connecting all electrode layers with the first polarity of the plural first capacitative elements and all electrode layers with the first polarity of the plural second capacitative elements; and
plural individual connection holes provided around the common connection hole and connecting each electrode layer with the second polarity of the plural first capacitative elements to the adjacent electrode layer with the second polarity of the plural second capacitative elements.

2. The thin-film capacitor according to claim 1, wherein the plural individual connection holes are isotropically arranged around the common connection hole.

3. The thin-film capacitor according to claim 1, wherein all electrode layers with the second polarity of the plural first capacitative elements and all electrode layers with the second polarity of the plural second capacitative elements are connected by the plural individual connection holes.

4. The thin-film capacitor according to claim 1, wherein at least one of the plural first capacitative elements and the plural second capacitative elements has an area different from areas of others.

5. The thin-film capacitor according to claim 1, wherein the plural first capacitative elements and the plural second capacitative elements each has a sector shape and entirely form a circular shape.

6. The thin-film capacitor according to claim 5, wherein at least one of the plural first capacitative elements and the plural second capacitative elements has an center angle different from center angles of others.

7. The thin-film capacitor according to claim 1, wherein the plural first capacitative elements and the plural second capacitative elements are stacked in multiple layers.

8. A multilayer wiring board comprising:
a thin-film capacitor,
the thin-film capacitor including
plural first capacitative elements each having an electrode layer with a first polarity on an upper surface of a dielectric layer and an electrode layer with a second polarity on a lower surface of the dielectric layer and arranged around a specific position,
plural second capacitative elements each having an electrode layer with the second polarity on the upper surface of the dielectric layer and an electrode layer with the first polarity on the lower surface of the dielectric layer and arranged around the specific position alternately with the plural first capacitative elements,
a single common connection hole provided in the specific position and connecting all electrode layers with the first polarity of the plural first capacitative elements and all electrode layers with the first polarity of the plural second capacitative elements, and
plural individual connection holes provided around the common connection hole and connecting each electrode layer with the second polarity of the plural first capacitative elements to the adjacent electrode layer with the second polarity of the plural second capacitative elements.

9. A semiconductor device comprising:
a chip; and
a multilayer wiring board,
the thin-film capacitor including
plural first capacitative elements each having an electrode layer with a first polarity on an upper surface of a dielectric layer and an electrode layer with a second polarity on a lower surface of the dielectric layer and arranged around a specific position,
plural second capacitative elements each having an electrode layer with the second polarity on the upper surface of the dielectric layer and an electrode layer with the first polarity on the lower surface of the dielectric layer and arranged around the specific position alternately with the plural first capacitative elements,
a single common connection hole provided in the specific position and connecting all electrode layers with the first polarity of the plural first capacitative elements and all electrode layers with the first polarity of the plural second capacitative elements, and
plural individual connection holes provided around the common connection hole and connecting each electrode layer with the second polarity of the plural first capacitative elements to the adjacent electrode layer with the second polarity of the plural second capacitative elements.

* * * * *